United States Patent [19]

Hentschel et al.

[11] Patent Number: 4,872,080
[45] Date of Patent: Oct. 3, 1989

[54] PROTECTIVE CIRCUIT FOR A SEMICONDUCTOR LASER

[75] Inventors: Christian Hentschel, Holzgerlingen; Wolfgang Schmid, Stuttgart, both of Fed. Rep. of Germany

[73] Assignee: Hewlett-Packard Company, Palo Alto, Calif.

[21] Appl. No.: 638,095

[22] Filed: Aug. 6, 1984

[30] Foreign Application Priority Data

Aug. 30, 1983 [DE] Fed. Rep. of Germany ....... 3331132

[51] Int. Cl.$^4$ .............................................. H02H 9/02
[52] U.S. Cl. .......................................... 361/57; 361/98
[58] Field of Search ................. 361/54, 56, 57, 93, 361/98, 173; 373/38; 250/205; 323/224, 902

[56] References Cited

U.S. PATENT DOCUMENTS

| | | | |
|---|---|---|---|
| 3,483,428 | 12/1969 | LaPlante | 250/205 |
| 3,626,249 | 12/1971 | Snedeker | 361/56 |
| 3,691,426 | 9/1972 | Mankovitz | 361/57 X |
| 3,873,905 | 3/1975 | Marek | 361/56 X |
| 4,074,334 | 2/1978 | D'Arrigo et al. | 361/56 |
| 4,162,398 | 7/1979 | Kayanuma | 250/205 |
| 4,186,418 | 1/1980 | Seiler | 361/56 X |
| 4,507,767 | 3/1985 | Takasugi | 250/205 |

OTHER PUBLICATIONS

*Electronics*, vol. 54, No. 1, Jan. 13, 1981, pp. 173–175, Kularatna, A.D.V.N., "Optosensor Limits Shoot Supply's No Load Current".

Primary Examiner—A. D. Pellinen
Assistant Examiner—Anthony Wysocki
Attorney, Agent, or Firm—William H. F. Howard

[57] ABSTRACT

A protective circuit for a semiconductor laser supplied with an excitation current by a current generator circuit is created using a transducer, whose output is controlled by the laser light, a limit circuit cooperating with the transducer and a current shunt circuit energized by the limit circuit and switched in parallel with the semiconductor laser. Once the permissible emitted light power is reached, excessive excitation current is diverted to the shunt circuit. Exemplary embodiments of the invention are found to achieve response times below 20 ns and are able to protect the semiconductor laser from overload currents even during power-on and power off.

6 Claims, 2 Drawing Sheets

PROTECTIVE CIRCUIT FOR A SEMICONDUCTOR LASER

FIELD OF THE INVENTION

The invention relates to a protective circuit for a semiconductor laser. Such circuits are used for protecting semiconductor lasers (laser diodes) against lifetime reductions, or even destruction, caused by excessive field strengths at the two laser mirrors, i.e. by excessive emitted light power. Excessive emission of light power is caused by excessive excitation currents.

DESCRIPTION OF THE RELATED ART

In a known protective circuit of this kind for a semiconductor laser (DE-PS No. 29 11 858), a portion of the laser light is converted into a photo current which is proportional to the impinging light power and which is used for the control of the semiconductor laser. The photo current is subtracted as an actual value at the summation point of a non-inverting control amplifier from a current defining a rated value, so that a driver following the control amplifier increases the excitation current flowing through the semiconductor laser when the rated value is higher than the actual value, and vice versa reduces the excitation voltage when the rated value lies below the actual value. For achieving protection against the occurrence of a faulty rated value, a transistor substracts an additional current from the summation point when the voltage drop induced by the photo current at a resistor exceeds a predetermined maximum value which is equal to the maximum permissible light power. This simulates an increase of the light power so that the excitation current of the semiconductor laser is limited and, if need be, reduced via the control amplifier and the driver.

In the known protective circuit it is, however, possible that the semiconductor laser is overloaded by a fault of the control amplifier. Also, during the power-on and power-off switching phases of the device, the supply voltages can rise to their final value at different speeds, and can induce transient oscillations in the control amplifier with accompanying uncontrolled excessive driving currents. Since the already mentioned destruction mechanism in semiconductor lasers is not of a thermal but electrical nature, and laser diodes have bandwidths in the GHz range, excessive currents with a duration of only a few nanoseconds will suffice to cause damage.

SUMMARY OF THE INVENTION

The present invention solves the problem of protecting a semiconductor laser from overcurrents which occur through faults in the current driver circuit. In the present invention a shunt circuit is introduced which is connected in parallel with the semiconductor laser. The resistance of the shunt circuit is controlled by a limit circuit.

The shunt circuit can be a transistor connected as an emitterfollower which, when a control signal voltage at its base is sufficient to provide the base-emitter forward voltage necessary to turn on the transistor, is continuously conductive and correspondingly shunts the entire excitation current away from the semiconductor laser. Even at a short-circuit between the lightreceiving transducer and ground, the circuit still protects the semiconductor laser from an overload and is certainly substantially more reliable due to its simplicity than the circuit known in the art, in which the protective effect is only guaranteed if the power amplifier, the control amplifier and the driver transistor all function correctly.

If the limit circuit is also designed as an emitter-follower, a response time of less than 20 ns is achieved in the protective circuit so that the semiconductor laser is also protected against short-term or high-frequency overload currents. By means of the complementary transistors, the response threshold of the protective circuit is compensated for temperature-dependent deviations.

DETAILED DESCRIPTION OF THE INVENTION

Figure 1:
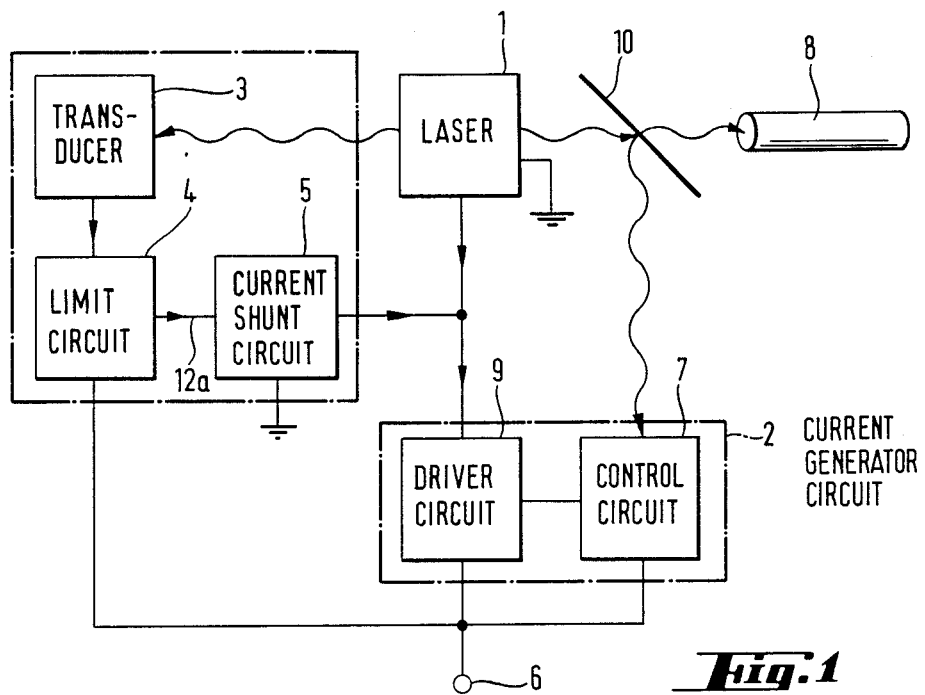
FIG. 1 shows a block diagram of a protective circuit in accordance with the invention.

In FIG. 1, a semiconductor laser 1 is optically coupled to an optical fiber 8 for the transmission of optical signals and to a transducer 3 for determining the radiated light power. A current generator circuit 2 with a driver circuit 9, which is fed by a voltage supply 6, supplies the semiconductor laser with the excitation current necessary for the generation of the laser light. The magnitude of the excitation current may e.g. be determined by a control circuit 7 contained in the current generator circuit 2. The control circuit 7 may, for example, be energized via a beam divider 10 with a portion of the radiation emitted by the laser 1, and can be designed at will to enable continuous wave or pulsed light operation.

A controllable shunt circuit 5 in parallel with the semiconductor laser 1 is connected to the common node of semiconductor laser 1 and driver circuit 9. The shunt circuit 5 is responsive to a continuously variable control signal 12a received from a limit circuit 4, which is connected to a transducer 3 and a voltage supply 6.

The light power of the semiconductor laser 1, which rises with the excitation current, is converted by the transducer 3 into a signal proportional thereto. This signal is compared to a maximum value by the limit circuit 4, the maximum value corresponding to a maximally permissible radiated light power. If this maximum value is reached, the shunt circuit 5 is energized by the control signal 12a so that the shunt circuit 5 conducts an increasing portion of the excitation current and the light power emitted by the semiconductor laser 1 does not rise any further. This independent absolute power limitation protects the semiconductor 1 in the event that an excessive excitation current occurs due to a fault in the current generator circuit 2.

Figure 2:
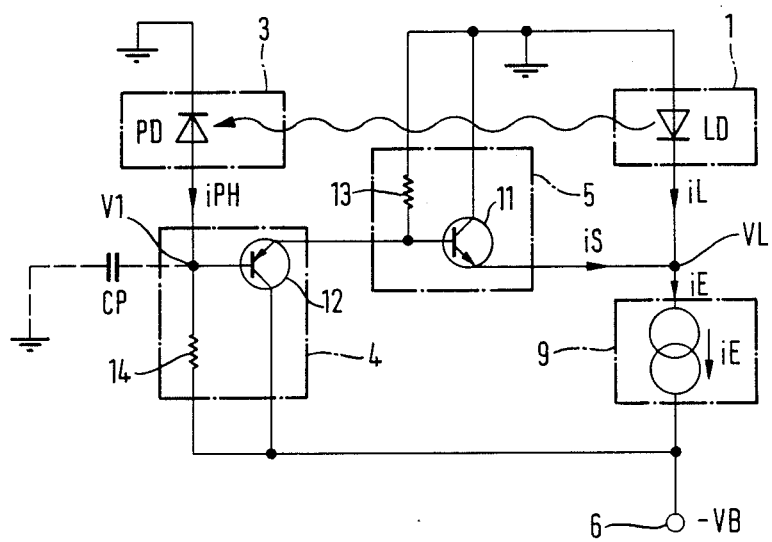
FIG. 2 shows a circuit diagram of an exemplary embodiment of the protective circuit in accordance with the invention.

An exemplary embodiment of a protective circuit in accordance with the invention is shown in FIG. 2. The design of the circuit is simple; it comprises 2 transistors 11, 12, two resistors 13, 14 and one diode 3. A shunt transistor 11 operating as an emitter-follower in parallel to the laser diode 1 can be switched in to shunt the laser diode 1; its base is connected to ground via a resistor 13 while its collector is connected directly to ground, and its emitter is connected to the node comprising the interconnection of the laser diode 1 and a drive circuit 9.

The collector of a sense transistor 12, which is complementary to the shunt transistor 11, is connected to a negative supply voltage VB 6 for the driver circuit 9 as shown in the exemplary embodiment. A sense resistor 14 is located between the base and collector of the sense transistor 12, and its emitter is connected to the base of the shunt transistor 11 so that the sense transistor 12 is also operated in the emitter-follower configuration.

The light power radiated from the rear side of the laser diode 1 impinges on a photodiode 3, typically installed in a same housing as the diode 1. The photodiode 3 is connected to the sense resistor 14 connected between the base and collector of the sense transistor 12. The photodiode 3 is reverse biased so that with light exposure a photocurrent iPH flows across the sense resistor 14. At the occurrence of the maximally permissible radiated light power, a certain voltaged drop VL will develop at the laser diode 1 and also at the emitter of the shunt transistor 11, and the photodiode 3 will generate a respective maximum photocurrent iPHmax. For achieving the limiting effect, the sense resistor 14 is made to equal:

$$RD = \frac{VB - VL}{iPHmax} \quad (1)$$

If the laser radiates at low power, then iPH is smaller than iPHmax and the voltage V1 at the base of the sense transistor 12 is more negative than VL. This voltage is transmitted to the base of the shunt transistor 11 with an added offset voltage equal to one base-emitter forward voltage via the emitter-follower sense transistor 12. However, because V1 is more negative than VL, the voltage applied between the base and the emitter of the shunt transistor 11 is smaller than the base-emitter forward voltage necessary for turning on the transistor. The currentn flowing through the shunt transistor 11 is thus practically equal to zero, and therefore the shunt transistor 11 is not operating. If the photocurrent iPH exceeds the maximum permissible value iPHmax, then the voltage V1 will become greater than VL according to the selection of the value of the sense resistor 14. In turn, the shunt transistor 11 becomes conductive and takes over a portion of currentn iS of the excitation current iE so that the current iL=iE−iS flowing through the semiconductor laser is limited to the maximum permissible value.

The illustrated protective circuit of FIG. 2 responds very rapidly because it consists of two emitter-followers 11, 12 having typically a high cut-off frequency. The only dominant time constant tDOM relevant to the behavior of the circuit is determined by the sense resistor 114 and the parasitic capacitance CP indicated in FIG. 2. The capacittance CP is composed of the parasitic ca[acitances of the individual circuit elements interconnected at the input of the sense transistor 12. Since only a single dominant time constant exists, the circuit is not prone to instability. A typical value for the dominant time constant tDOM would be $$tDOM = RD \times CP = 1 \text{ Kohms} \times 5 \text{ pF} = 5 \text{ ns},$$

where RD is the value of the sense resistor 14. Thi gives a typical response time of 11 ns for the entire protective circuit. This value can be additionally improved on by a higher bias voltage of the photodiode 3 or by a reduction of RD. Through the symmetrical connection of the complementary transistors 11, 12 their temperature-dependent base-emitter voltages are mutually compensated. If the laser diode 1 and tthe photodiode 3 are maintained at a constant temperature, for example, by a regulated Peltier element, which is a known technique in the art, then all values in equation (1) are temperature-independent to a first approximation. Using a non-temperature-controlled laser diode 1 and photodiode 3 their temperature dependency can be adjusted by making the sense resistor 14 tempeature-dependent, which is known in the art. The protective circuit in accordance with FIG. 2 even protects the laser 1 from an overload during the power-on and power-off switching phases of the supply voltage 6, because the circuit is already operative at minimal operating voltages. In accordance with the parameters of typical laser diodes, a minimal forward voltage of approximately 2 V is required at the laser diode in order to effect a substantial current flow. Usually, a voltage difference of at least 1 V needs to be present at the driver circuit before substantial current can flow. From switchon until the time at which the supply voltage 6 mounts to approximately 3 V, the semiconductor is therefore not endangered. However, this voltage is already completely sufficient to operate the protective circuit. During the remaining switch-on phase and during the corresponding portion of the switch-off phase the protective circuit is active so that transient oscillations or defects of the current output generator 2 occurring even during these time intervals cannot destroy the semiconductor 1.

Equation (1) can be rearranged giving the photocurrent as follows:

$$iPHmax = \frac{VB - VL}{RD} \quad (2)$$

Figure 3:
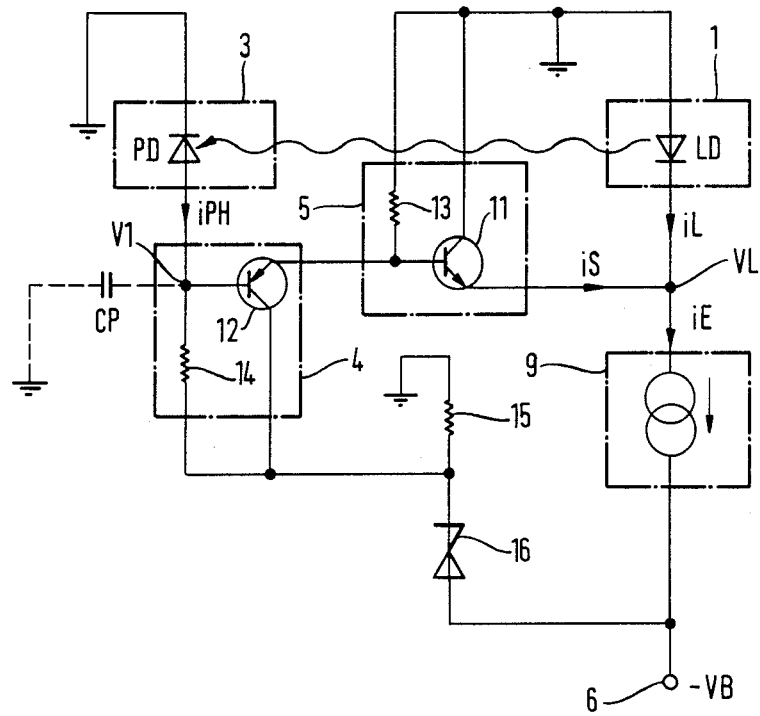
FIG. 3 shows a further embodiment of the protective circuit as shown in FIG. 2.

This equation shows that at lower supply voltages VB, the limiting effect is initiated at lower photocurrents iPHmax and thus at even lower light powers than would be the case at full supply voltage. The protective circuit circuit thus only allows full excitation of the semiconductor laser 1 after the full supply voltage is reached. An embodiment as in FIG. 3 is also possible. In this embodiment, the protective circuit receives its operating voltage from the voltage supply 6 via a zener diode 16 and a zener resistor 15. As long as the supply voltage 6 is less than the zener voltage VZ of the zener diode 16, the collector of the sense transistor 12 is grounded via the zener resistor 15. The sense transistor 12 is thus cut off and the control signal is at zero potential.

Consequently, the shunt transistor 11 is completely turned on because the necessary base current for shunt transistor 11 can flow through the shunt resistor 13. During the corresponding portion of the power-on and power-off switching phases, the laser diode 1 is therefore switched off completely and thus cannot be destroyed. At supply voltages above the zener voltage VZ the circuit operates in the aforementioed fashion if the sense resistor 14 is made to equal:

$$RD = \frac{VH - VL}{iPHmax} \quad (3)$$

where VH is the voltage VH=VB−VZ then present at the collector of the sense transistor 12.

We claim:

1. A protective circuit which protects a semiconductor laser, said semiconductor laser connected to a current generator circuit providing an excitation current to the semiconductor laser for the generation of laser light, comprising:

(1) a transducer which detects light power emitted by said semiconductor laser;

(2) a limit circuit coupled to the transducer and providing a variable control signal in response to the detection of emited light power exceeding a predetermined maximum value of the detected light power; and (3) a shunt circuit connected in parallel with the semiconductor laser, the shunt circuit receiving said control signal from the limit circuit and in response thereto shunting partial excitation current away from the semiconductor laser while limiting the emitted light power to the predetermined maximum value.

2. The protective circuit in accordance with claim 1, wherein the shunt circuit is a first transistor connected as an emitter-follower, having its emitter connected to a node comprising an interconnection of the semiconductor laser and the current generator circuit, having its collector directly connected to ground and having its base connected to ground via a resistor.

3. The protective circuit in accordance with claim 2, wherein the transducer is a photodiode whose current flows across a sense resistor, and wherein the limit circuit comprises a second transistor which is complementary to the first transistor and which is connected as an emitter-follower, the voltage drop generated by the current of the photodiode at the sense resistor occurring between the base and collector of the second transistor and the emitter of the second transistor being connected to the base of the first transistor.

4. The protective circuit in accordance with claim 1, further comprising a voltage supply for the current generator circuit; wherein the shunt circuit fully shunts the excitation current away from the semiconductor laser when the control signal is at zero potential; wherein the limit circuit additionally compares the supply voltage with a minimum value; and wherein the limit circuit maintains the control signal at zero potential as long as the supply voltage is less than the minimum value.

5. The protective circuit in accordance with claim 4, wherein the limit circuit receives its supply voltage from the voltage supply for the current generator circuit via a threshold value switch; and wherein the threshold switch shuts off the voltage supply to the limit circuit so long as the magnitude of the supply voltage of the current generator circuit is smaller than the minimum value.

6. The protective circuit in accordance with claim 5, wherein the threshold value switch is a zener diode.

* * * * *

UNITED STATES PATENT AND TRADEMARK OFFICE
CERTIFICATE OF CORRECTION

PATENT NO. : 4,872,080

DATED : October 3, 1989

INVENTOR(S) : Christian Hentschel & Wolfgang Schmid

It is certified that error appears in the above-identified patent and that said Letters Patent is hereby corrected as shown below:

Column 4, Line 68, "laser connected" should read -- laser being connected --;

Column 5, Line 14, "thereto shunting" should read -- thereto being capable of shunting -- ;

Column 6, Line 9, "circuit fully shunts" should read -- circuit is capable of fully shunting --.

Signed and Sealed this

Twenty-fifth Day of September, 1990

Attest:

HARRY F. MANBECK, JR.

*Attesting Officer*     *Commissioner of Patents and Trademarks*